United States Patent
Lee et al.

(10) Patent No.: US 12,557,639 B2
(45) Date of Patent: Feb. 17, 2026

(54) SEMICONDUCTOR DEVICES

(71) Applicant: Samsung Electronics Co., Ltd., Suwon-si (KR)

(72) Inventors: Dayoung Lee, Suwon-si (KR); Jun-Woo Lee, Bucheon-si (KR); Sungdong Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 872 days.

(21) Appl. No.: 17/509,463

(22) Filed: Oct. 25, 2021

(65) Prior Publication Data

US 2022/0336365 A1 Oct. 20, 2022

(30) Foreign Application Priority Data

Apr. 15, 2021 (KR) .................. 10-2021-0049209

(51) Int. Cl.
| | |
|---|---|
| *H01L 23/532* | (2006.01) |
| *H01L 23/528* | (2006.01) |
| *H10B 12/00* | (2023.01) |

(52) U.S. Cl.
CPC .... *H01L 23/53219* (2013.01); *H01L 23/5283* (2013.01); *H01L 23/53223* (2013.01); *H10B 12/315* (2023.02); *H10B 12/34* (2023.02)

(58) Field of Classification Search
CPC .......... H01L 23/53219; H01L 23/5283; H01L 23/53223; H10B 12/315; H10B 12/34
See application file for complete search history.

(56) References Cited

U.S. PATENT DOCUMENTS

| | | | |
|---|---|---|---|
| 5,738,917 A | 4/1998 | Besser et al. | |
| 5,747,879 A | 5/1998 | Rastogi et al. | |
| 6,207,553 B1 * | 3/2001 | Buynoski .......... | H01L 21/76885 |
| | | | 438/645 |

(Continued)

FOREIGN PATENT DOCUMENTS

| | | |
|---|---|---|
| JP | 3972128 B2 | 9/2007 |
| KR | 10-2022-0117385 A | 8/2022 |
| TW | 200822282 A | 5/2008 |

OTHER PUBLICATIONS

Srikar, V.T. "Electromigration Behavior and Reliability of Bamboo Al(Cu) Interconnects for Integrated Circuits", Diss. Massachusetts Institute of Technology, 1999.

(Continued)

*Primary Examiner* — Eugene Lee
(74) *Attorney, Agent, or Firm* — Morgan, Lewis & Bockius LLP

(57) ABSTRACT

A semiconductor device includes a lower structure including a substrate and a cell structure on the substrate and a plurality of interconnection layers, which are stacked on the lower structure in a first direction extending perpendicular to a top surface of the substrate. An uppermost interconnection layer of the plurality of interconnection layers includes uppermost conductive lines. Each of the uppermost conductive lines includes a lower metal compound pattern, a metal pattern, an upper metal compound pattern, and a capping pattern, which are sequentially stacked in the first direction. The lower metal compound pattern, the metal pattern, and the upper metal compound pattern include a same metallic element.

15 Claims, 9 Drawing Sheets

(56) References Cited

U.S. PATENT DOCUMENTS

| | | | |
|---|---|---|---|
| 6,258,466 B1* | 7/2001 | McTeer | H01L 21/32051 |
| | | | 257/E21.295 |
| 6,274,487 B1* | 8/2001 | Suzuki | H01L 21/76843 |
| | | | 438/653 |
| 6,342,733 B1 | 1/2002 | Hu et al. | |
| 6,818,546 B2 | 11/2004 | Saito et al. | |
| 6,975,032 B2 | 12/2005 | Chen et al. | |
| 7,470,992 B2 | 12/2008 | Thei et al. | |
| 9,418,856 B2* | 8/2016 | Bordelon | H01L 21/288 |
| 10,643,890 B2 | 5/2020 | Edelstein et al. | |
| 2003/0186498 A1 | 10/2003 | Lee | |
| 2005/0194688 A1* | 9/2005 | Gotkis | H01L 23/5222 |
| | | | 257/E23.161 |
| 2006/0017161 A1 | 1/2006 | Chung et al. | |
| 2006/0261478 A1 | 11/2006 | Thei et al. | |
| 2008/0064124 A1* | 3/2008 | Wang | H01L 28/65 |
| | | | 438/3 |
| 2010/0184286 A1* | 7/2010 | Kansaku | H01L 21/31105 |
| | | | 257/E21.585 |
| 2011/0097897 A1* | 4/2011 | Tanaka | H01L 21/76882 |
| | | | 438/653 |
| 2011/0221064 A1 | 9/2011 | Chapple-Sokol et al. | |
| 2011/0269308 A1* | 11/2011 | Kansaku | H01L 23/53223 |
| | | | 438/653 |
| 2012/0261747 A1* | 10/2012 | Park | H01L 29/4966 |
| | | | 257/330 |
| 2015/0221557 A1* | 8/2015 | Kim | H01L 23/53295 |
| | | | 438/301 |
| 2015/0364427 A1* | 12/2015 | Kansaku | H01L 21/02244 |
| | | | 438/643 |
| 2018/0337126 A1* | 11/2018 | Zhang | H01L 21/76831 |
| 2019/0148224 A1 | 5/2019 | Kuroda et al. | |
| 2019/0148291 A1* | 5/2019 | Peng | H01L 21/76885 |
| | | | 257/411 |
| 2019/0165257 A1 | 5/2019 | Lee et al. | |
| 2020/0083162 A1* | 3/2020 | Yang | H01L 23/53223 |
| 2020/0098685 A1* | 3/2020 | Lee | H01L 21/3212 |
| 2020/0161240 A1* | 5/2020 | Yu | H01L 21/02362 |
| 2021/0210378 A1* | 7/2021 | Hsu | H01L 21/76811 |

OTHER PUBLICATIONS

Li, Meng, et al. "Effect of hydrogen on the integrity of aluminium-oxide interface at elevated temperatures", Nature Communications, Feb. 20, 2017, DOI: 10.1038/ncomms14564.

* cited by examiner

SEMICONDUCTOR DEVICES

CROSS-REFERENCE TO RELATED APPLICATIONS

This U.S. non-provisional patent application claims priority under 35 U.S.C. § 119 to Korean Patent Application No. 10-2021-0049209, filed on Apr. 15, 2021, in the Korean Intellectual Property Office, the entire contents of which are hereby incorporated by reference.

BACKGROUND

The present inventive concepts relate to semiconductor devices and methods of fabricating the same, and in particular, to semiconductor devices including metal wirings and methods of fabricating the same.

Due to their small-sized, multifunctional, and/or low-cost characteristics, semiconductor devices are being esteemed as important elements in the electronics industry. The semiconductor devices are classified into semiconductor memory devices for storing data, semiconductor logic devices for processing data, and hybrid semiconductor devices including both of memory and logic elements.

Due to the increasing demand for electronic devices with a fast speed and/or low power consumption, the semiconductor devices may be desired to have a fast operating speed and/or a low operating voltage. Accordingly, it may be desired to increase an integration density of the semiconductor device. However, an increase in the integration density of the semiconductor device may lead to deterioration in reliability of the semiconductor device.

SUMMARY

Some example embodiments of the inventive concepts provide a semiconductor device with improved electric characteristics and a method of fabricating the same.

Some example embodiments of the inventive concepts provide a semiconductor device with improved reliability and a method of fabricating the same.

Some example embodiments of the inventive concepts provide a semiconductor device with improved electric characteristics, including improved integration, and improved reliability, and a method of fabricating the same.

According to some example embodiments of the inventive concepts, a semiconductor device may include a lower structure including a substrate and a cell structure on the substrate. The semiconductor device may include a plurality of interconnection layers, which are stacked on the lower structure in a first direction that extends perpendicular to a top surface of the substrate. An uppermost interconnection layer of the plurality of interconnection layers may include uppermost conductive lines. Each of the uppermost conductive lines may include a lower metal compound pattern, a metal pattern, an upper metal compound pattern, and a capping pattern, which are sequentially stacked in the first direction. The lower metal compound pattern, the metal pattern, and the upper metal compound pattern may include a same metallic element.

According to some example embodiments of the inventive concepts, a semiconductor device may include a conductive line on a substrate and a passivation layer on the substrate such that the passivation layer covers the conductive line. The conductive line may include a lower metal compound pattern, a metal pattern, an upper metal compound pattern, and a capping pattern, which are sequentially stacked in a first direction that extends perpendicular to a top surface of the substrate. The metal pattern may include aluminum, and each of the lower and upper metal compound patterns may include a metal compound. The metal compound may contain aluminum and an additional metallic element.

According to some example embodiments of the inventive concepts, a semiconductor device may include a substrate, a circuit layer on a first surface of the substrate, a conductive pad on the circuit layer and connected to the circuit layer, an insulating layer on the circuit layer such that the insulating layer covers the conductive pad, and a redistribution pattern on the insulating layer. A portion of the redistribution pattern may penetrate the insulating layer and may be connected to the conductive pad. The redistribution pattern may include a lower metal compound pattern, a metal pattern, and an upper metal compound pattern, which are sequentially stacked. The metal pattern may include a first metallic element, and each of the lower and upper metal compound patterns may include the first metallic element and a second metallic element. The second metallic element is different from the first metallic element.

DETAILED DESCRIPTION

Figure 1:
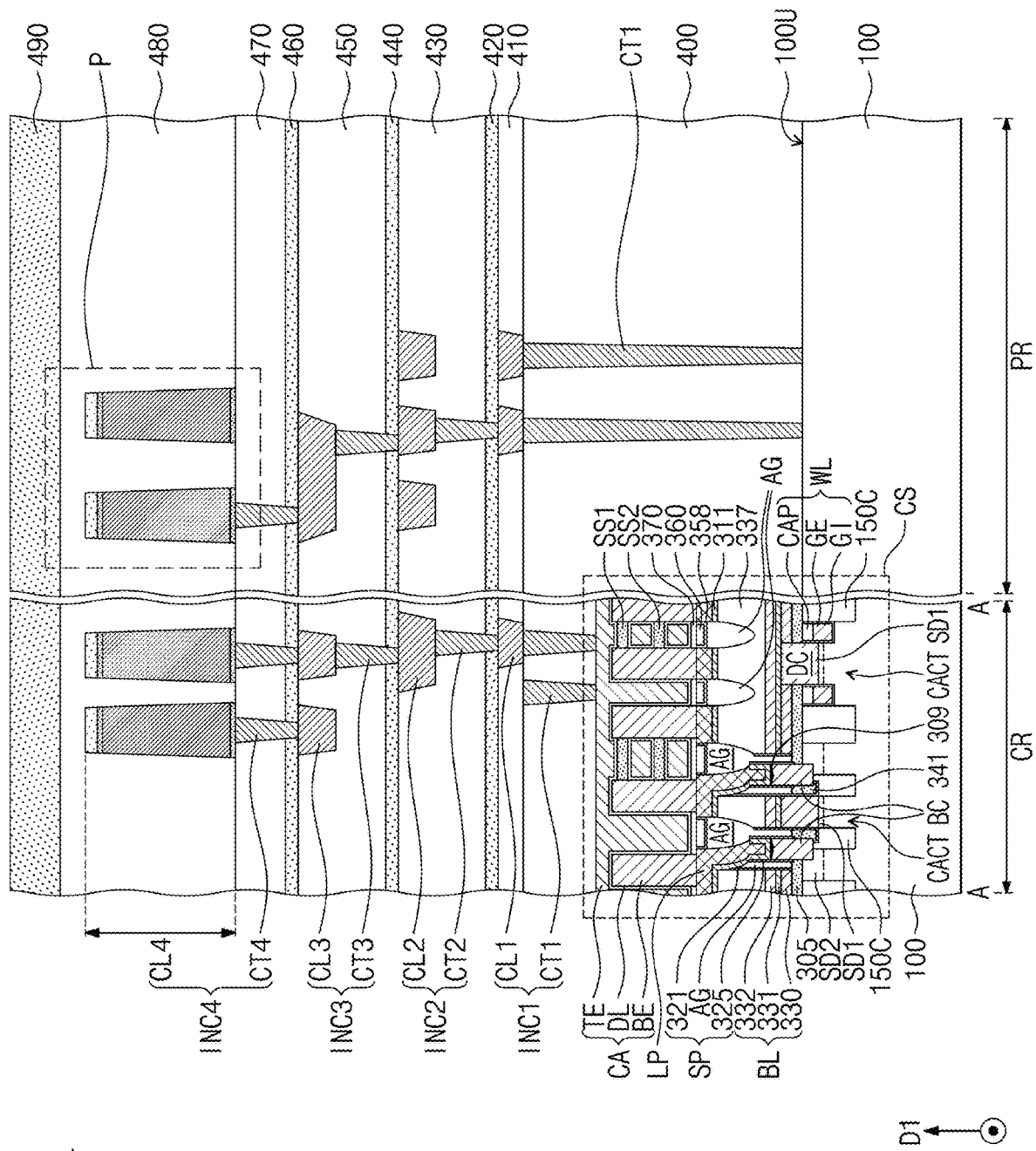
FIG. 1 is a sectional view illustrating a semiconductor device according to some example embodiments of the inventive concepts.

Some example embodiments of the inventive concepts will now be described more fully with reference to the accompanying drawings, in which some example embodiments are shown.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 2:
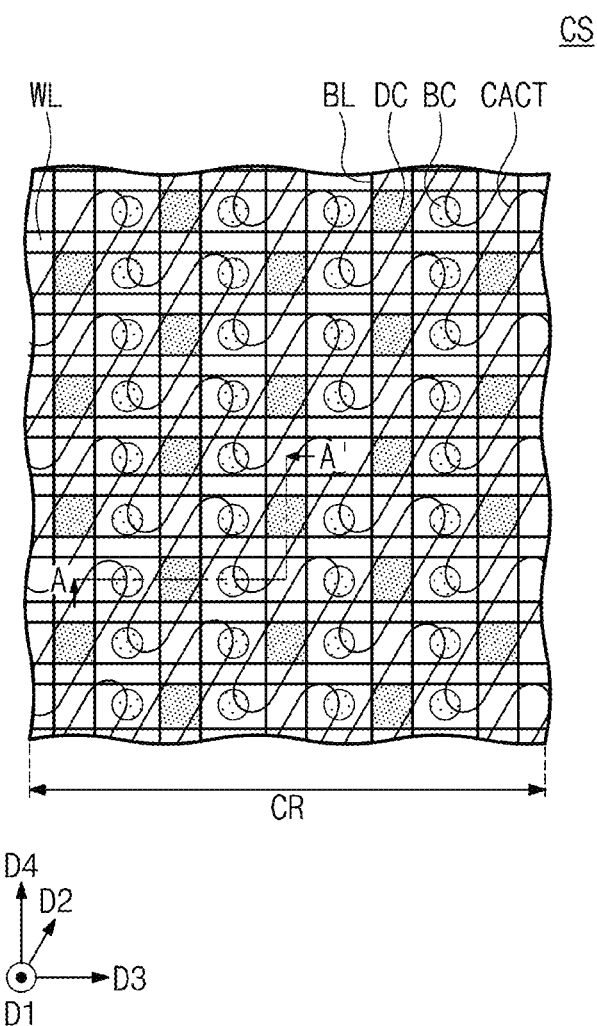
FIG. 2 is a plan view of a cell structure of the semiconductor device of FIG. 1 according to some example embodiments of the inventive concepts.
Figure 3:
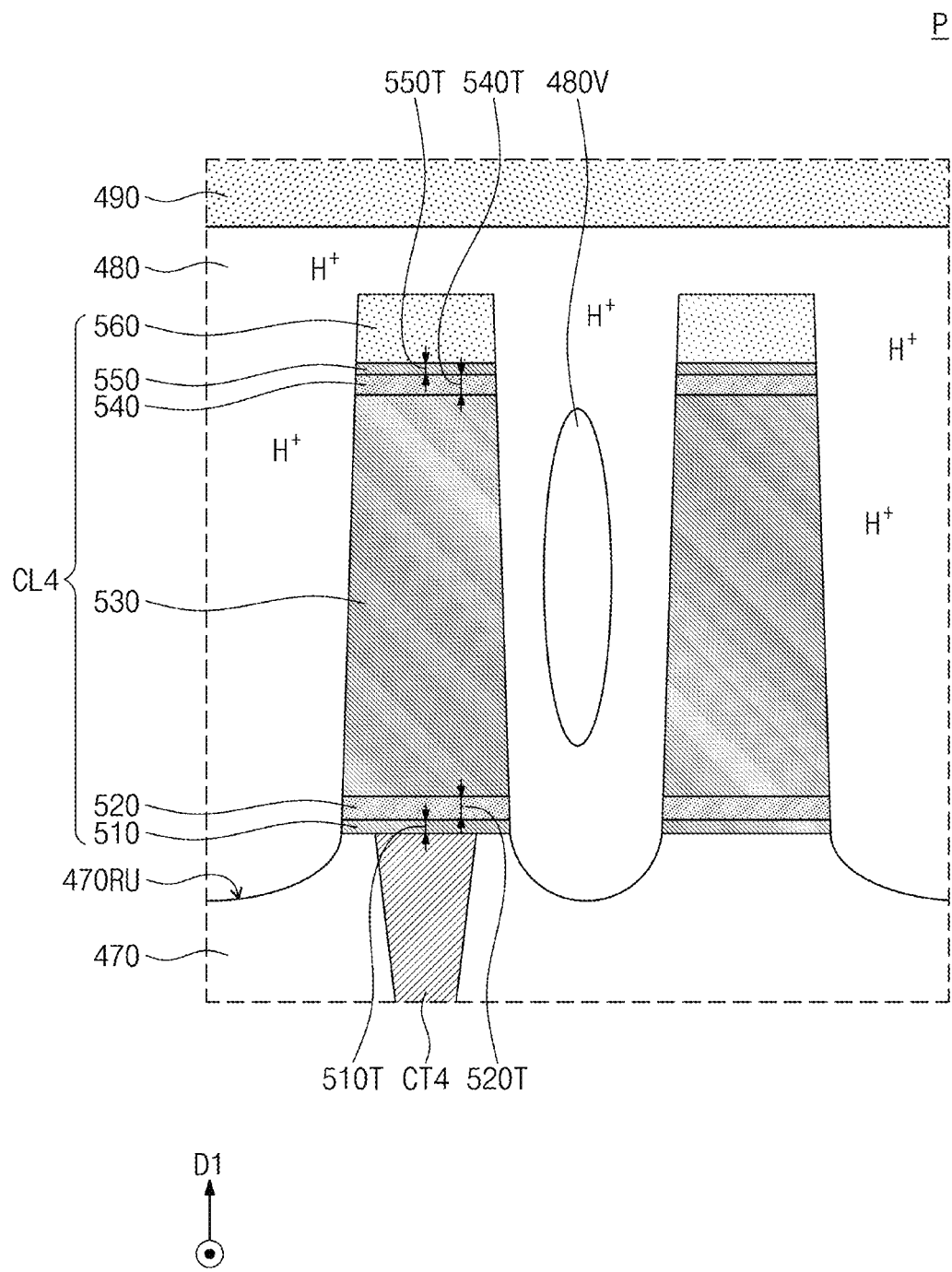
FIG. 3 is an enlarged sectional view of a portion 'P' of FIG. 1 according to some example embodiments of the inventive concepts.

FIG. 1 is a sectional view illustrating a semiconductor device according to some example embodiments of the inventive concepts. FIG. 2 is a plan view of a cell structure of the semiconductor device of FIG. 1, and FIG. 3 is an enlarged sectional view of a portion 'P' of FIG. 1.

Referring to FIGS. 1 and 2, a substrate 100 including a cell region CR and a peripheral region PR may be provided. The substrate 100 may be a semiconductor substrate (e.g., a silicon wafer, a germanium wafer, or a silicon-germanium wafer). A cell structure CS may be disposed on the cell region CR of the substrate 100 and thus may be understood to be on the substrate 100, and peripheral circuits may be disposed on the peripheral region PR of the substrate 100.

The cell structure CS may include cell device isolation patterns 150C, which are disposed in the cell region CR of the substrate 100. The cell device isolation patterns 150C may define cell active patterns CACT. The cell active patterns CACT may be portions of the substrate 100 which protrude in a first direction D1 that, as shown in FIG. 1, extends perpendicular to a top surface 100U of the substrate 100. Each of the cell active patterns CACT may be a bar-shaped pattern that is elongated in a second direction D2 parallel to the top surface 100U of the substrate 100. The cell device isolation patterns 150C may be interposed between the cell active patterns CACT and may be formed of or include at least one of oxide, nitride, and/or oxynitride.

The cell structure CS may include word lines WL disposed on the cell region CR of the substrate 100. The word lines WL may be provided to cross the cell active patterns CACT and the cell device isolation patterns 150C. The word lines WL may be extended in a third direction D3 crossing the second direction D2 and may be spaced apart from each other in a fourth direction D4 crossing the second and third directions D2 and D3. The third direction D3 and the fourth direction D4 may be parallel to the top surface 100U of the substrate 100. Each of the word lines WL may include a cell gate electrode GE buried in the substrate 100, a cell gate dielectric pattern GI interposed between the cell gate electrode GE and the cell active patterns CACT and between the cell gate electrode GE and the cell device isolation patterns 150C, and a cell gate capping pattern CAP provided on a top surface of the cell gate electrode GE. The cell gate electrode GE may be referred to herein as a buried gate electrode that is buried in the substrate 100 so as to be enclosed within the substrate 100 and/or enclosed within a volume space defined by outer surfaces of the substrate 100, said outer surfaces including at least the top surface 100U of the substrate 100. The cell gate electrode GE may be formed of or include a conductive material. As an example, the conductive material may be one of doped semiconductor materials (doped silicon, doped germanium, and so forth), conductive metal nitrides (titanium nitride, tantalum nitride, and so forth), metallic materials (tungsten, titanium, tantalum, and so forth), and metal-semiconductor compounds (tungsten silicide, cobalt silicide, titanium silicide, and so forth). The cell gate dielectric pattern GI may include, for example, a silicon oxide layer, a silicon nitride layer, and/or a silicon oxynitride layer. The cell gate capping pattern CAP may include, for example, a silicon oxide layer, a silicon nitride layer, and/or a silicon oxynitride layer.

The cell structure CS may include a first impurity region SD1 and second impurity regions SD2, which are disposed in each of the cell active patterns CACT and are within the substrate 100. The second impurity regions SD2 may be spaced apart from each other with the first impurity region SD1 interposed therebetween. The first impurity region SD1 may be provided between a pair of word lines WL, which are provided to cross the cell active patterns CACT. The second impurity regions SD2 may be spaced apart from each other with the pair of word lines WL interposed therebetween. Accordingly, a first impurity region SD1 and a second impurity region SD2 of a cell structure CS may be at opposite sides of a cell gate electrode GE of a word line WL. The first impurity region SD1 may have the same conductivity type as the second impurity regions SD2.

The cell structure CS may include an insulating layer 305 disposed on the cell region CR of the substrate 100, bit lines BL provided on the insulating layer 305, and bit line capping patterns 337 provided on the bit lines BL. The insulating layer 305 may cover the word lines WL and the cell active patterns CACT. The bit lines BL may be provided to cross the word lines WL. One of the bit lines BL may be connected to a second impurity region SD2 that is at an opposite side of a cell gate electrode GE from a first impurity region SD1. The bit lines BL may be extended in the fourth direction D4 and may be spaced apart from each other in the third direction D3. Each of the bit lines BL may include a polysilicon pattern 330, an ohmic pattern 331, and a metal-containing pattern 332, which are sequentially stacked in the first direction D1. The bit line capping patterns 337 may be disposed on the bit lines BL, respectively. The bit line capping patterns 337 may be formed of or include at least one of insulating materials (e.g., silicon nitride).

The cell structure CS may include bit line contacts DC, which are disposed below each of the bit lines BL. Below each of the bit lines BL, the bit line contacts DC may be spaced apart from each other in the fourth direction D4. Each of the bit line contacts DC may be electrically connected to the first impurity region SD1. Each of the bottom electrodes BE may be connected (e.g., electrically connected) to the first impurity region SD1. The bit line contacts DC may be formed of or include at least one of doped semiconductor materials (doped silicon, doped germanium, and so forth), conductive metal nitrides (titanium nitride, tantalum nitride, and so forth), metallic materials (tungsten, titanium, tantalum, and so forth), or metal-semiconductor compounds (tungsten silicide, cobalt silicide, titanium silicide, and so forth). The cell structure CS may include a lower insulating gap fill layer 341, which is disposed on a side surface of each of the bit line contacts DC.

The cell structure CS may include storage node contacts BC, which are disposed between an adjacent pair of the bit lines BL, and a bit line spacer SP, which is interposed between each of the bit lines BL and the storage node contacts BC. The storage node contacts BC may be spaced apart from each other in the fourth direction D4. The storage node contacts BC may be formed of or include doped or undoped polysilicon. The bit line spacer SP may include a first sub-spacer 321 and a second sub-spacer 325, which are spaced apart from each other by an air gap AG. The first sub-spacer 321 may cover a sidewall of each of the bit lines BL and a sidewall of each of the bit line capping patterns 337. The second sub-spacer 325 may be adjacent to the storage node contacts BC. The first sub-spacer 321 and the second sub-spacer 325 may be formed of or include the same material (e.g., silicon nitride).

The cell structure CS may include a storage node ohmic layer 309 disposed on each of the storage node contacts BC, a diffusion prevention pattern 311 provided on the storage node ohmic layer 309, and a landing pad LP provided on the diffusion prevention pattern 311. The storage node ohmic layer 309 may be formed of or include metal silicide. The diffusion prevention pattern 311 may conformally cover the storage node ohmic layer 309, the first and second sub-spacers 321 and 325, and the bit line capping patterns 337. The diffusion prevention pattern 311 may be formed of or include at least one of metal nitrides (e.g., titanium nitride or tantalum nitride). The landing pad LP may be formed of or include a metal-containing material (e.g., tungsten). An upper portion of the landing pad LP may have a width that is larger than that of the storage node contact BC. The upper portion of the landing pad LP may be shifted from the storage node contact BC in a direction parallel to the top surface 100U of the substrate 100.

The cell structure CS may include a first capping pattern 358 and a second capping pattern 360, which are interposed between adjacent ones of the landing pads LP. Each of the first and second capping patterns 358 and 360 may be formed of or include at least one of silicon nitride, silicon oxide, silicon oxynitride, or porous materials. The air gap AG between the first and second sub-spacers 321 and 325 may be extended into regions between the landing pads LP. The first capping pattern 358, the bit line capping pattern 337, and the landing pad LP may be partially exposed by the air gap AG.

The cell structure CS may include a capacitor CA, which is provided on the cell region CR of the substrate 100. The capacitor CA may include bottom electrodes BE disposed on the landing pads LP, respectively, a top electrode TE covering the bottom electrodes BE (e.g., covering the bottom electrodes BE in at least the first direction D1 and in some example embodiments at least partially in a direction extending parallel to the top surface 100U of the substrate 100), and a dielectric layer DL interposed between each of the bottom electrodes BE and the top electrode TE. The bottom electrodes BE may be spaced apart from each other (e.g., isolated from direct contact with each other) in a direction extending parallel to the top surface 100U of the substrate 100 (e.g., perpendicular to the first direction D1). The bottom electrodes BE may be formed of or include at least one of doped poly-silicon, metal nitrides (e.g., titanium nitride), or metals (e.g., tungsten, aluminum, and copper). Each of the bottom electrodes BE may have a circular pillar shape, a hollow cylinder shape, or a cup shape.

The cell structure CS may include an upper support pattern SS1 and a lower support pattern SS2, which are provided to support the bottom electrodes BE. The upper support pattern SS1 may be provided to support upper sidewalls of the bottom electrodes BE, and the lower support pattern SS2 may be provided to support lower sidewalls of the bottom electrodes BE. The upper and lower support patterns SS1 and SS2 may be formed of or include at least one of insulating materials (e.g., silicon nitride, silicon oxide, and silicon oxynitride). The cell structure CS may include an etch stop layer 370, which is provided between the bottom electrodes BE to cover the first and second capping patterns 358 and 360. The etch stop layer 370 may be formed of or include at least one of insulating materials (e.g., silicon nitride, silicon oxide, and silicon oxynitride).

The dielectric layer DL may be provided to cover surfaces of the bottom electrodes BE and surfaces of the upper and lower support patterns SS1 and SS2. The top electrode TE may be disposed on the dielectric layer DL to fill a space between the bottom electrodes BE. The top electrode TE may include at least one of a doped poly-silicon layer, a doped silicon germanium layer, a metal nitride layer (e.g., a titanium nitride layer), or a metallic layer (e.g., tungsten, aluminum, and copper layers). The dielectric layer DL may include at least one of a silicon oxide layer or a high-k material layer (e.g., a hafnium oxide layer, a zirconium oxide layer etc.)

A plurality of interconnection layers INC1, INC2, INC3, and INC4 may be stacked in the first direction D1 on the substrate 100 and the cell structure CS. The substrate 100 and the cell structure CS may be referred to as a lower structure. In some example embodiments, the interconnection layers INC1, INC2, INC3, and INC4 may include a first interconnection layer INC1, a second interconnection layer INC2, a third interconnection layer INC3, and a fourth interconnection layer INC4, which are sequentially stacked in the first direction D1. The first interconnection layer INC1 may be the lowermost interconnection layer of the interconnection layers INC1, INC2, INC3, and INC4, and the fourth interconnection layer INC4 may be the uppermost interconnection layer of the interconnection layers INC1, INC2, INC3, and INC4. FIG. 1 illustrates an example in which the second interconnection layer INC2 and the third interconnection layer INC3 is disposed between the lowermost interconnection layer (i.e., the first interconnection layer INC1) and the uppermost interconnection layer (i.e., the fourth interconnection layer INC4), but the inventive concepts are not limited to this example. Additional interconnection layers may be provided between the lowermost interconnection layer (i.e., the first interconnection layer INC1) and the uppermost interconnection layer (i.e., the fourth interconnection layer INC4).

The first interconnection layer INC1 may include first conductive contacts CT1 and first conductive lines CL1 on the first conductive contacts CT1. The first conductive contacts CT1 may be disposed on the cell region CR and the peripheral region PR of the substrate 100. Some of the first conductive contacts CT1 may be connected to the top electrode TE of the capacitor CA, and others of the first conductive contacts CT1 may be electrically connected to the peripheral region PR of the substrate 100 (e.g., the peripheral circuit). The first conductive lines CL1 may be disposed on the cell region CR and the peripheral region PR of the substrate 100. Each of the first conductive lines CL1 may be connected to a corresponding one of the first conductive contacts CT1. The first conductive contacts CT1 and the first conductive lines CL1 may be formed of or include at least one of metallic materials (e.g., copper, tungsten, aluminum, and so forth) or conductive metal nitrides.

A first lower interlayer insulating layer 400 may be disposed on the cell region CR and the peripheral region PR of the substrate 100. The first lower interlayer insulating layer 400 may cover the cell structure CS on the cell region CR and may cover the peripheral region PR of the substrate (e.g., the peripheral circuit). Each of the first conductive contacts CT1 may be provided to penetrate the first lower interlayer insulating layer 400 and may be connected to the top electrode TE of the capacitor CA or the substrate (e.g., the peripheral circuit). The first conductive lines CL1 may be disposed on the first lower interlayer insulating layer 400 and may be connected to the first conductive contacts CT1.

A first upper interlayer insulating layer 410 may be provided on the cell region CR and the peripheral region PR to cover the first lower interlayer insulating layer 400. The first upper interlayer insulating layer 410 may cover side surfaces of the first conductive lines CL1. Top surfaces of the first conductive lines CL1 may be substantially coplanar with a top surface of the first upper interlayer insulating layer 410. As an example, the top surfaces of the first conductive lines CL1 may be located at substantially the same height as the top surface of the first upper interlayer insulating layer 410. In the present specification, the height may be a vertical distance from the top surface 100U of the substrate 100. Each of the first conductive lines CL1 may be provided to penetrate the first upper interlayer insulating layer 410 and may be connected to a corresponding one of the first conductive contacts CT1. The first lower interlayer insulating layer 400 and the first upper interlayer insulating layer 410 may be referred to as a first interlayer insulating layer. The first lower interlayer insulating layer 400 and the first upper interlayer insulating layer 410 may be formed of or include at least one of, for example, silicon oxide, silicon nitride, and/or silicon oxynitride.

A first protection insulating layer 420 may be provided on the cell region CR and the peripheral region PR to cover the first upper interlayer insulating layer 410. The first protection insulating layer 420 may cover the top surfaces of the first conductive lines CL1. The first protection insulating layer 420 may be formed of or include, for example, silicon nitride.

The second interconnection layer INC2, which may be understood to be stacked between the first interconnection layer INC1 and the fourth interconnection layer INC4 (e.g., uppermost interconnection layer), may include second conductive contacts CT2 and second conductive lines CL2 on the second conductive contacts CT2. The second conductive contacts CT2 may be disposed on the cell region CR and the peripheral region PR of the substrate 100. Each of the second conductive contacts CT2 may be connected to a corresponding one of the first conductive lines CL1. The second conductive lines CL2 may be disposed on the cell region CR and the peripheral region PR of the substrate 100. Each of the second conductive lines CL2 may be connected to a corresponding one of the second conductive contacts CT2. The second conductive contacts CT2 and the second conductive lines CL2 may be formed of or include at least one of metallic materials (e.g., copper, tungsten, aluminum, and so forth) or conductive metal nitrides.

A second interlayer insulating layer 430 may be provided on the cell region CR and the peripheral region PR to cover the first protection insulating layer 420, the second conductive contacts CT2, and the second conductive lines CL2. Each of the second conductive contacts CT2 may be provided to penetrate a lower portion of the second interlayer insulating layer 430 and the first protection insulating layer 420 and may be connected to the corresponding first conductive line CL1. Each of the second conductive lines CL2 may be provided to penetrate an upper portion of the second interlayer insulating layer 430 and may be connected to the corresponding second conductive contact CT2. The second conductive lines CL2 may have top surfaces that are substantially coplanar with a top surface of the second interlayer insulating layer 430. As an example, the top surfaces of the second conductive lines CL2 may be located at substantially the same height as the top surface of the second interlayer insulating layer 430. The second interlayer insulating layer 430 may be formed of or include at least one of, for example, silicon oxide, silicon nitride, and/or silicon oxynitride.

A second protection insulating layer 440 may be provided on the cell region CR and the peripheral region PR to cover the second interlayer insulating layer 430. The second protection insulating layer 440 may cover the top surfaces of the second conductive lines CL2. The second protection insulating layer 440 may be formed of or include, for example, silicon nitride.

The third interconnection layer INC3 may include third conductive contacts CT3 and third conductive lines CL3 on the third conductive contacts CT3. The third conductive contacts CT3 may be disposed on the cell region CR and the peripheral region PR of the substrate 100. Each of the third conductive contacts CT3 may be connected to a corresponding one of the second conductive lines CL2. The third conductive lines CL3 may be disposed on the cell region CR and the peripheral region PR of the substrate 100. Each of the third conductive lines CL3 may be connected to a corresponding one of the third conductive contacts CT3. The third conductive contacts CT3 and the third conductive lines CL3 may be formed of or include at least one of metallic materials (e.g., copper, tungsten, aluminum, and so forth) or conductive metal nitrides.

A third interlayer insulating layer 450 may be provided on the cell region CR and the peripheral region PR to cover the second protection insulating layer 440, the third conductive contacts CT3, and the third conductive lines CL3. Each of the third conductive contacts CT3 may be provided to penetrate a lower portion of the third interlayer insulating layer 450 and the second protection insulating layer 440 and may be connected to the corresponding second conductive line CL2. Each of the third conductive lines CL3 may be provided to penetrate an upper portion of the third interlayer insulating layer 450 and may be connected to the corresponding third conductive contact CT3. Top surfaces of the third conductive lines CL3 may be substantially coplanar with a top surface of the third interlayer insulating layer 450. As an example, the top surfaces of the third conductive lines CL3 may be located at substantially the same height as the top surface of the third interlayer insulating layer 450. The third interlayer insulating layer 450 may be formed of or include at least one of, for example, silicon oxide, silicon nitride, and/or silicon oxynitride.

A third protection insulating layer 460 may be provided on the cell region CR and the peripheral region PR to cover the third interlayer insulating layer 450. The third protection insulating layer 460 may cover the top surfaces of the third conductive lines CL3. The third protection insulating layer 460 may be formed of or include, for example, silicon nitride.

The fourth interconnection layer INC4 (e.g., uppermost interconnection layer) may include fourth conductive contacts CT4 and fourth conductive lines CL4 on the fourth conductive contacts CT4. The fourth conductive contacts CT4 may be disposed on the cell region CR and the peripheral region PR of the substrate 100. Each of the fourth conductive contacts CT4 may be connected to a corresponding one of the third conductive lines CL3. The fourth conductive lines CL4 may be disposed on the cell region CR and the peripheral region PR of the substrate 100. Each of the fourth conductive lines CL4 may be connected to a corresponding one of the fourth conductive contacts CT4. The fourth conductive contacts CT4 may be formed of or include at least one of metallic materials (e.g., copper, tungsten, aluminum, and so forth) or conductive metal nitrides.

A fourth interlayer insulating layer 470 may be provided on the cell region CR and the peripheral region PR to cover the third protection insulating layer 460 and the fourth conductive contacts CT4. Each of the fourth conductive contacts CT4 may be provided to penetrate the fourth interlayer insulating layer 470 and the third protection insulating layer 460 and may be connected to the corresponding third conductive line CL3. The fourth conductive lines CL4 may be disposed on the fourth interlayer insulating layer 470. The fourth interlayer insulating layer 470 may be formed of or include at least one of, for example, silicon oxide, silicon nitride, and/or silicon oxynitride.

The fourth interconnection layer INC4 may be the uppermost interconnection layer of the interconnection layers INC1, INC2, INC3, and INC4 (e.g., plurality of interconnection layers that are stacked on the lower structure comprising the substrate 100 and cell structure CS in the first direction D1), and the fourth conductive lines CL4 may be referred to as the uppermost conductive lines included within the uppermost interconnection layer.

Referring to FIGS. 1 and 3, each of the fourth conductive lines CL4 (e.g., uppermost conductive lines) may include a lower metal compound pattern 520, a metal pattern 530, an upper metal compound pattern 540, and a capping pattern 560, which are sequentially stacked in the first direction D1. The lower metal compound pattern 520, the metal pattern 530, and the upper metal compound pattern 540 may be formed of or include the same metallic element (e.g., a same metallic element). A metallic element, as described herein, may include one or more metal elements (e.g., one or more "metals"). The metal pattern 530 may include a first metallic element, and each of the lower and upper metal compound patterns 520 and 540 may include a compound of the first metallic element. The lower and upper metal compound patterns 520 and 540 may be formed of or include the same material (e.g., may have a same or identical total material composition). The lower metal compound pattern 520 may be in contact (e.g., direct contact) with a bottom surface of the metal pattern 530. The upper metal compound pattern 540 may be interposed between the metal pattern 530 and the capping pattern 560 and may be in contact (e.g., direct contact) with a top surface of the metal pattern 530. The metal pattern 530 may include aluminum, and each of the lower metal compound pattern 520 and the upper metal compound pattern 540 may include aluminum and an additional metallic element that is different from aluminum. The additional metallic element may include titanium. Each of the lower metal compound pattern 520 and the upper metal compound pattern 540 may include an aluminum-titanium compound.

As described herein, a layer or structure that is "formed of," "contains, or "includes" one or more materials (e.g., any element, any compound, any combination thereof, or the like) may partially comprise the one or more materials or may entirely comprise (e.g., may consist of) the one or more materials.

In some example embodiments, each of the fourth conductive lines CL4 may further include a lower metal pattern 510, which is spaced apart from (e.g., isolated from direct contact with) the metal pattern 530 with the lower metal compound pattern 520 interposed therebetween, and an upper metal pattern 550, which is spaced apart from (e.g., isolated from direct contact with) the metal pattern 530 with the upper metal compound pattern 540 interposed therebetween. The upper metal pattern 550 may be interposed between the upper metal compound pattern 540 and the capping pattern 560, and the lower metal pattern 510 may be interposed between the corresponding fourth conductive contact CT4 and the lower metal compound pattern 520.

Each of the lower and upper metal patterns 510 and 550 may be formed of or include a second metallic element that is different from the first metallic element that is included in the metal pattern 530. Each of the lower and upper metal compound patterns 520 and 540 may include the first metallic element and the second metallic element. Each of the lower and upper metal compound patterns 520 and 540 may be formed of or include a metal compound containing the first metallic element and the second metallic element (e.g., an alloy of the first and second metallic elements). Each of the lower and upper metal compound patterns 520 and 540 may have a mechanical strength that is higher than the metal pattern 530 and may have resistivity that is lower than the lower and upper metal patterns 510 and 550. The first metallic element may be aluminum. The second metallic element may be titanium. The metal pattern 530 may be formed of or include aluminum, and each of the lower and upper metal patterns 510 and 550 may be formed of or include the second element (e.g., titanium). Each of the lower and upper metal compound patterns 520 and 540 may be formed of or include aluminum-titanium compounds (e.g., aluminum-titanium alloys).

Each of the lower metal pattern 510, the lower metal compound pattern 520, the upper metal compound pattern 540, and the upper metal pattern 550 may have a thickness in the first direction D1. In some example embodiments, a thickness 520T in the first direction D1 (also referred to herein as a second thickness in the first direction D1) of the lower metal compound pattern 520 may be greater than a thickness 510T in the first direction D1 (also referred to herein as a first thickness in the first direction D1) of the lower metal pattern 510, and a thickness 540T in the first direction D1 (also referred to herein as a fourth thickness in the first direction D1) of the upper metal compound pattern 540 may be greater than a thickness 550T in the first direction D1 (also referred to herein as a third thickness in the first direction D1) of the upper metal pattern 550.

The capping pattern 560 may be formed of or include at least one of Ta, TaN, Ti, TiN, WSi, WN, CoWP, Ni, or Co. In some example embodiments, the capping pattern 560 may be formed of or include a nitride of the second metallic element (e.g., TiN).

A passivation layer 480 may be provided on the cell region CR and the peripheral region PR to cover the fourth interlayer insulating layer 470 and the fourth conductive lines CL4. The fourth interlayer insulating layer 470 may have a recessed top surface 470RU, which is between the fourth conductive lines CL4 and is recessed into the fourth interlayer insulating layer 470, and the passivation layer 480 may cover the recessed top surface 470RU of the fourth interlayer insulating layer 470. In some example embodiments, the passivation layer 480 may include a void 480V, which is between the fourth conductive lines CL4. The passivation layer 480 may be formed of (e.g., may include) a hydrogen-containing insulating material (e.g., hydrogen-containing silicon oxides).

As described herein, an element that "covers" another element (e.g., the passivation layer 480 covering the fourth conductive lines CL4) may directly contact and/or overlap one or more, or all, surfaces of the other element that are exposed from other elements. For example, referring to FIG. 3, the passivation layer 480 that covers the fourth conductive lines CL4 may contact and overlap, in the first direction D1 and directions extending perpendicular to the first direction, surfaces of the fourth conductive lines CL4 that are exposed from the fourth interlayer insulating layer 470 and fourth conductive contacts CT4 (e.g., top and side surfaces of the fourth conductive lines CL4).

An upper protection layer 490 may be provided on the cell region CR and the peripheral region PR to cover the passivation layer 480. The upper protection layer 490 may be formed of or include, for example, silicon nitride.

To reduce a defect caused by a silicon dangling bond in the substrate 100, a thermal treatment process may be performed after the formation (e.g., deposition) of the passivation layer 480. During the thermal treatment process, hydrogen atoms in the passivation layer 480 may be diffused into the substrate 100 through the interconnection layers INC1, INC2, INC3, and INC4 and may be bonded with silicon atoms in the substrate 100. Accordingly, it may be possible to reduce defects caused by the silicon dangling bond. Since the interconnection layers INC1, INC2, INC3, and INC4 are used as the diffusion path of the hydrogen atoms in the passivation layer 480, an amount of hydrogen atoms, which are left in the uppermost conductive lines of the uppermost layer of the interconnection layers INC1, INC2, INC3, and INC4 (e.g., the fourth conductive lines CL4 in the fourth interconnection layer INC4), may be increased. In the case where the amount of hydrogen atoms left in the uppermost conductive lines (i.e., the fourth conductive lines CL4) is increased, the uppermost conductive lines (i.e., the fourth conductive lines CL4) may have deteriorated mechanical/electric characteristics, and moreover, a failure, such as void, may occur in the metal pattern 530 of each of the uppermost conductive lines (i.e., the fourth conductive lines CL4).

According to some example embodiments of the inventive concepts, each of the uppermost conductive lines in the uppermost layer of the interconnection layers INC1, INC2, INC3, and INC4 (e.g., the fourth conductive lines CL4 in the fourth interconnection layer INC4) may include the metal pattern 530, the lower metal compound pattern 520 in contact with the bottom surface of the metal pattern 530, and the upper metal compound pattern 540 in contact with the top surface of the metal pattern 530. The metal pattern 530 may include the first metallic element, and each of the lower and upper metal compound patterns 520 and 540 may include a metal compound, which contains the first metallic element and the second metallic element. Since each of the uppermost conductive lines (i.e., the fourth conductive lines CL4) includes the lower and upper metal compound patterns 520 and 540 that are in contact with the bottom and top surfaces, respectively, of the metal pattern 530, the mechanical strength of the uppermost conductive lines (i.e., the fourth conductive lines CL4) may be increased, and it may be possible to prevent or suppress a disconnection failure from occurring in the uppermost conductive lines (i.e., the fourth conductive lines CL4), or reduce the magnitude or size of the occurred disconnection failure. In addition, since the lower and upper metal compound patterns 520 and 540 are provided to be in contact with the bottom and top surfaces, respectively, of the metal pattern 530, it may be possible to prevent or suppress a failure, such as void, from occurring in the metal pattern 530, or reduce the magnitude or size of the occurred failure (e.g., void size).

Accordingly, it may be possible to improve electrical and reliability characteristics of the semiconductor device.

Figure 4:
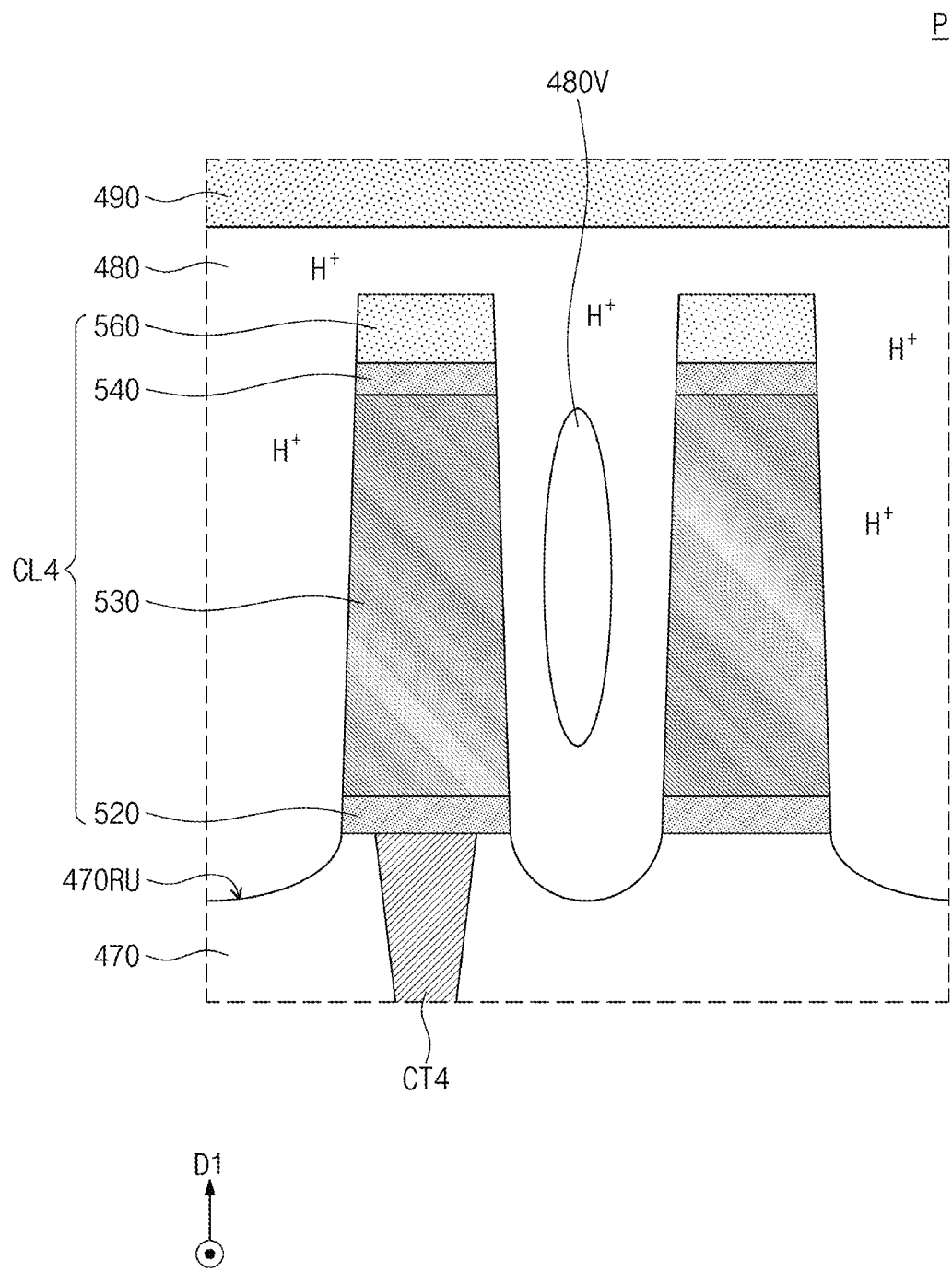
FIG. 4 is an enlarged sectional view illustrating a semiconductor device according to some example embodiments of the inventive concepts and corresponding to the portion 'P' of FIG. 1.

FIG. 4 is an enlarged sectional view illustrating a semiconductor device according to some example embodiments of the inventive concepts and corresponding to the portion 'P' of FIG. 1. For the sake of brevity, features, which are different from the semiconductor device described with reference to FIGS. 1 to 3, will be mainly described below.

Referring to FIGS. 1 and 4, each of the fourth conductive lines CL4 may include the lower metal compound pattern 520, the metal pattern 530, the upper metal compound pattern 540, and the capping pattern 560, which are sequentially stacked in the first direction D1. In some example embodiments, the lower metal compound pattern 520 may be interposed between the metal pattern 530 and the corresponding fourth conductive contact CT4 and may be in contact with the bottom surface of the metal pattern 530 and the top surface of the corresponding fourth conductive contact CT4. The upper metal compound pattern 540 may be interposed between the metal pattern 530 and the capping pattern 560 and may be in contact with the top surface of the metal pattern 530 and the bottom surface of the capping pattern 560. In some example embodiments, each of the fourth conductive lines CL4 may not include the lower and upper metal patterns 510 and 550 described with reference to FIGS. 1 to 3.

The metal pattern 530 may include the first metallic element, and each of the lower and upper metal compound patterns 520 and 540 may include the first metallic element and an additional metallic element (i.e., the second metallic element). Each of the lower and upper metal compound patterns 520 and 540 may be formed of or include a metal compound containing the first metallic element and the additional metallic element (i.e., the second metallic element) or an alloy of the first metallic element and the additional metallic element (i.e., the second metallic element). The first metallic element may be aluminum, and the additional metallic element (i.e., the second metallic element) may be titanium. The metal pattern 530 may be formed of or include aluminum, and each of the lower and upper metal compound patterns 520 and 540 may be formed of or include an aluminum-titanium compound (e.g., an aluminum-titanium alloy).

Figure 5:
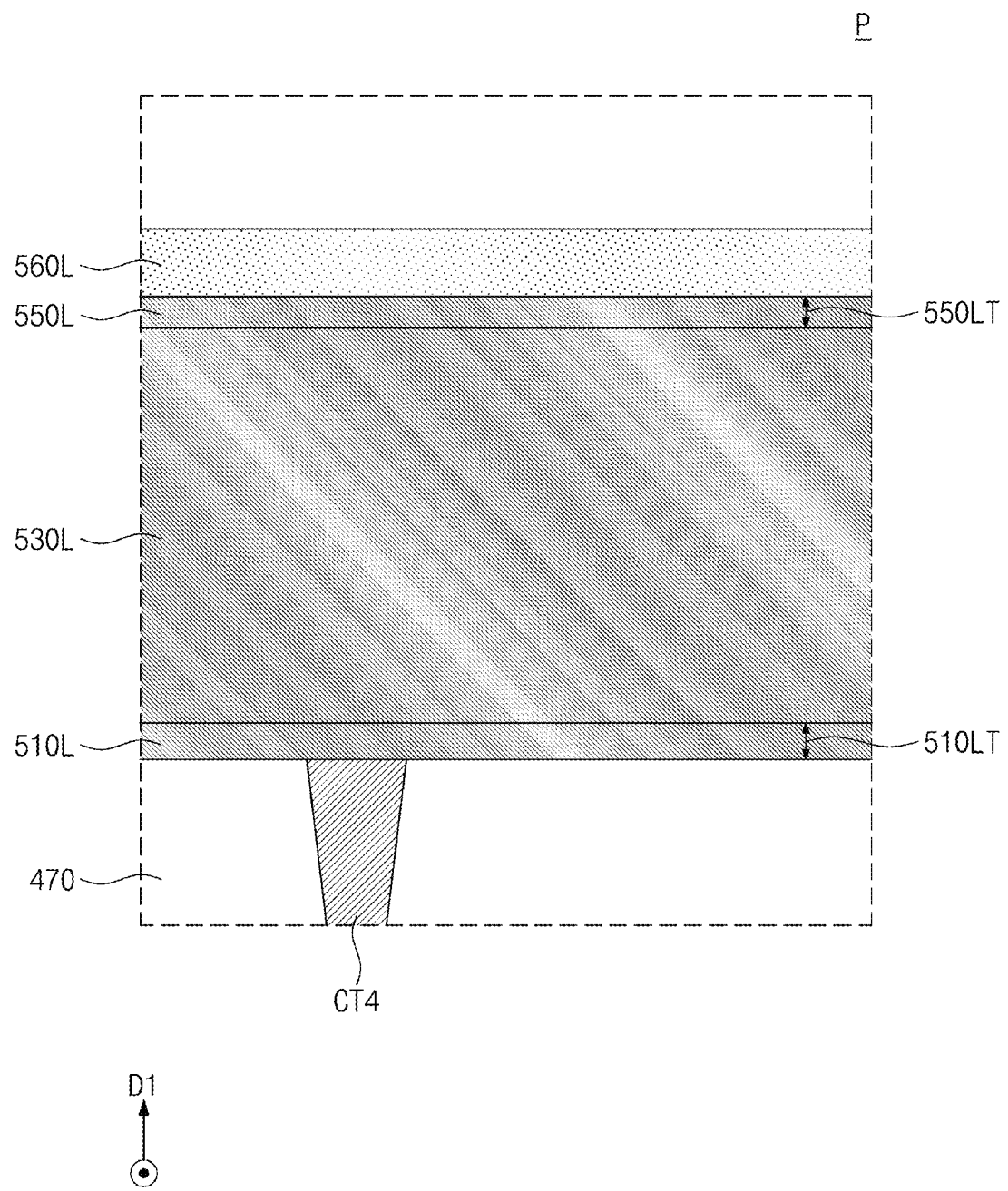
FIGS. 5, 6, and 7 are enlarged sectional views illustrating a method of fabricating a semiconductor device according to some example embodiments of the inventive concepts and corresponding to the portion 'P' of FIG. 1.
Figure 6:
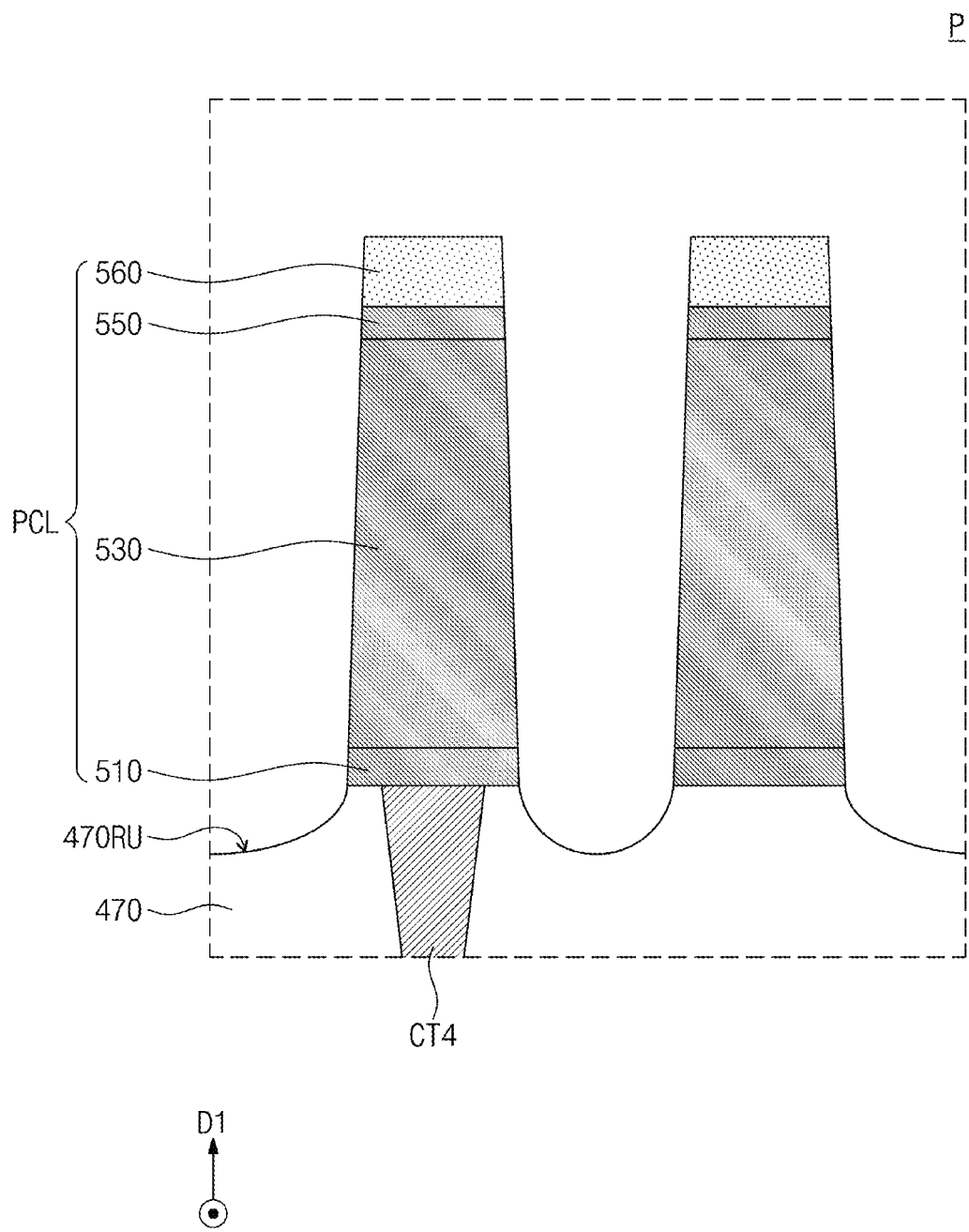
Figure 7:
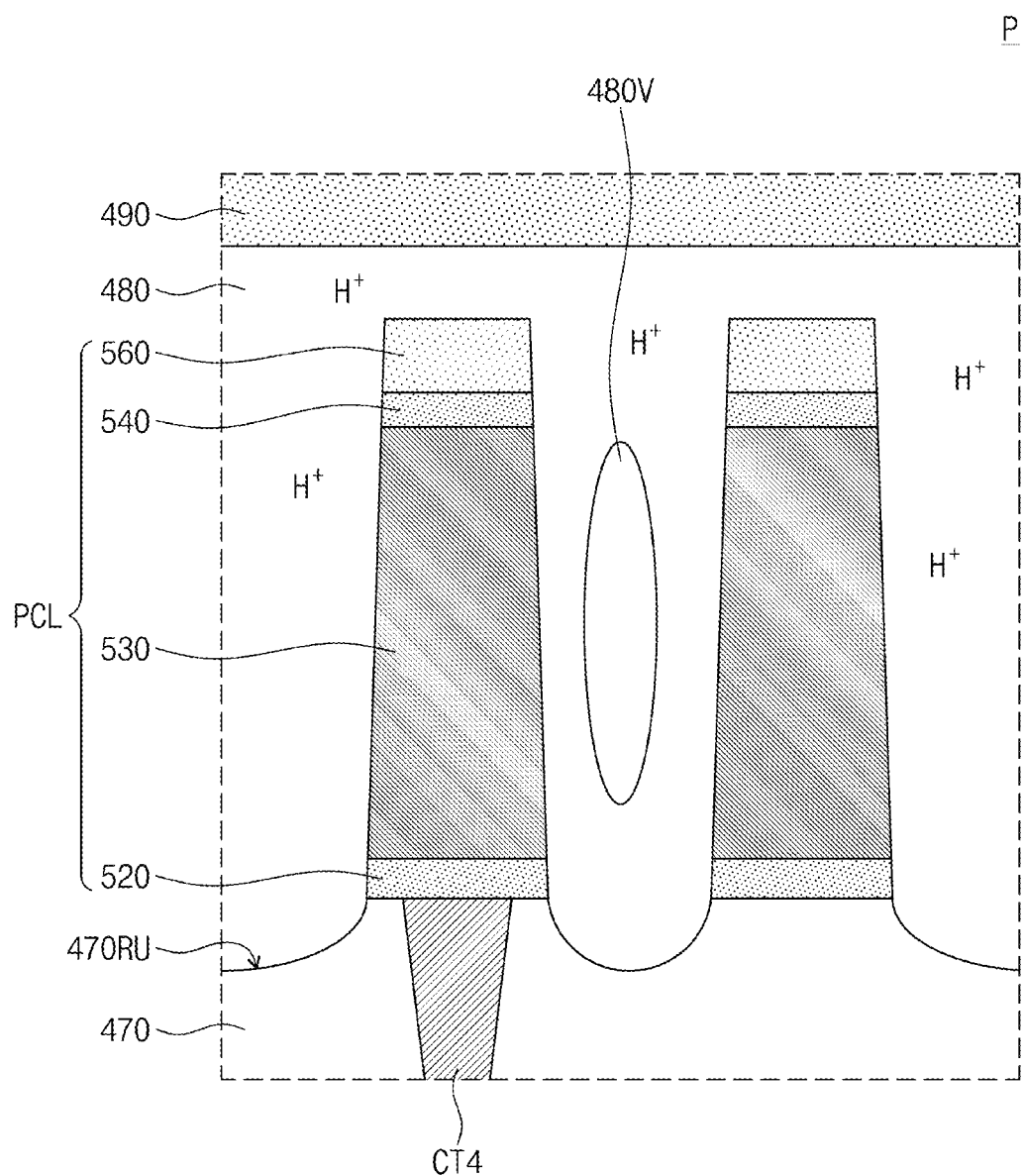

FIGS. 5, 6, and 7 are enlarged sectional views illustrating a method of fabricating a semiconductor device according to some example embodiments of the inventive concepts and corresponding to the portion 'P' of FIG. 1. For the sake of brevity, the same element as in the semiconductor device described with reference to FIGS. 1 to 3 will be identified by the same reference number without repeating an overlapping description thereof.

First, referring to FIG. 1, the substrate 100 including the cell region CR and the peripheral region PR may be provided, and the cell structure CS may be formed on the cell region CR of the substrate 100. The first lower interlayer insulating layer 400 may be formed on the cell region CR and the peripheral region PR of the substrate 100. The first lower interlayer insulating layer 400 may cover the cell structure CS on the cell region CR and may cover the peripheral region PR of the substrate (e.g., the peripheral circuit).

The first conductive contacts CT1 may be formed in the first lower interlayer insulating layer 400. In some example embodiments, the formation of the first conductive contacts CT1 may include forming first contact holes in the first lower interlayer insulating layer 400, forming a contact layer on the first lower interlayer insulating layer 400 to fill the first contact holes, and planarizing the contact layer to expose a top surface of the first lower interlayer insulating layer 400.

The first upper interlayer insulating layer 410 may be formed on the cell region CR and the peripheral region PR to cover the first lower interlayer insulating layer 400. The first upper interlayer insulating layer 410 may be formed to cover top surfaces of the first conductive contacts CT1. The first conductive lines CL1 may be formed in the first upper interlayer insulating layer 410. In some example embodiments, the formation of the first conductive lines CL1 may include forming first line trenches to penetrate the first upper interlayer insulating layer 410, forming a first conductive layer on the first upper interlayer insulating layer 410 to fill the first line trenches, and planarizing the first conductive layer to expose the top surface of the first upper interlayer insulating layer 410.

The first protection insulating layer 420 and the second interlayer insulating layer 430 may be sequentially stacked on the first upper interlayer insulating layer 410 and on the cell region CR and the peripheral region PR. The second conductive contacts CT2 and the second conductive lines CL2 may be formed in the second interlayer insulating layer 430. In some example embodiments, the formation of the second conductive contacts CT2 and the second conductive lines CL2 may include forming second line trenches to penetrate an upper portion of the second interlayer insulating layer 430, forming second contact holes, which are extended from bottom surfaces of the second line trenches, and each of which is formed to penetrate a lower portion of the second interlayer insulating layer 430 and the first protection insulating layer 420, forming a second conductive layer on the second interlayer insulating layer 430 to fill the second line trenches and the second contact holes, and planarizing the second conductive layer to expose a top surface of the second interlayer insulating layer 430.

The second protection insulating layer 440 and the third interlayer insulating layer 450 may be sequentially stacked on the second interlayer insulating layer 430 and on the cell region CR and the peripheral region PR. The third conductive contacts CT3 and the third conductive lines CL3 may be formed in the third interlayer insulating layer 450. The third conductive contacts CT3 and the third conductive lines CL3 may be formed by substantially the same method as that for the second conductive contacts CT2 and the second conductive lines CL2.

The third protection insulating layer 460 and the fourth interlayer insulating layer 470 may be sequentially stacked on the third interlayer insulating layer 450 and on the cell region CR and the peripheral region PR. The fourth conductive contacts CT4 may be formed in the fourth interlayer insulating layer 470. Each of the fourth conductive contacts CT4 may be formed to penetrate the fourth interlayer insulating layer 470 and the third protection insulating layer 460 and may be connected to a corresponding one of the third conductive lines CL3. In some example embodiments, the formation of the fourth conductive contacts CT4 may include forming fourth contact holes to penetrate the fourth interlayer insulating layer 470 and the third protection insulating layer 460, forming an additional contact layer on the fourth interlayer insulating layer 470 to fill the fourth contact holes, and planarizing the additional contact layer to expose the top surface of the fourth interlayer insulating layer 470.

Referring to FIGS. 1 and 5, a lower metal layer 510L, a metal layer 530L, an upper metal layer 550L, and a capping layer 560L may be sequentially stacked in the first direction D1 on the fourth interlayer insulating layer 470. The metal layer 530L may include the first metallic element, and each of the lower and upper metal layers 510L and 550L may include the second metallic element. The first metallic element may be aluminum, and the second metallic element may be titanium. Each of the lower and upper metal layers 510L and 550L may have a thickness in the first direction D1. A thickness 510LT of the lower metal layer 510L may range from 0 Å to 200 Å, and in some example embodiments, the thickness 510LT may be about 100 Å. A thickness 550LT of the upper metal layer 550L may range from 0 Å to 200 Å, and, in some example embodiments, the thickness 550LT may be about 100 Å.

Referring to FIGS. 1 and 6, the capping layer 560L, the upper metal layer 550L, the metal layer 530L, and the lower metal layer 510L may be sequentially patterned to form a capping pattern 560, an upper metal pattern 550, a metal pattern 530, and a lower metal pattern 510. In some example embodiments, the patterning of the capping layer 560L, the upper metal layer 550L, the metal layer 530L, and the lower metal layer 510L may include forming photoresist patterns on the capping layer 560L and performing an etching process to sequentially etch the capping layer 560L, the upper metal layer 550L, the metal layer 530L, and the lower metal layer 510L using the photoresist patterns as an etch mask. The lower metal pattern 510, the metal pattern 530, the upper metal pattern 550, and the capping pattern 560 may be sequentially stacked in the first direction D1 and may be referred to as a preliminary conductive line PCL. During the etching process, an upper portion of the fourth interlayer insulating layer 470 between adjacent ones of the preliminary conductive lines PCL may be recessed, and thus, the fourth interlayer insulating layer 470 may have a recessed top surface 470RU between the adjacent ones of the preliminary conductive lines PCL.

Referring to FIGS. 1 and 7, a passivation layer 480 may be formed on the cell region CR and the peripheral region PR to cover the fourth interlayer insulating layer 470. The passivation layer 480 may be formed to cover the preliminary conductive line PCL. The passivation layer 480 may be formed of a hydrogen-containing insulating material. In some example embodiments, a void 480V may be formed in the passivation layer 480 between the adjacent ones of the preliminary conductive lines PCL. An upper protection layer 490 may be formed on the cell region CR and the peripheral region PR to cover the passivation layer 480.

Referring back to FIGS. 1 and 3, a thermal treatment process may be performed, after the formation of the upper protection layer 490. As a result of the thermal treatment process, a portion of the lower metal pattern 510 and a lower portion of the metal pattern 530 may react with each other to form a lower metal compound pattern 520 between the lower metal pattern 510 and the metal pattern 530. In some example embodiments, a remaining portion of the lower metal pattern 510 may be left between a corresponding one of the fourth conductive contacts CT4 and the lower metal compound pattern 520. As a result of the thermal treatment process, a portion of the upper metal pattern 550 and an upper portion of the metal pattern 530 may react with each other to form an upper metal compound pattern 540 between the upper metal pattern 550 and the metal pattern 530. In some example embodiments, a remaining portion of the upper metal pattern 550 may be left between the upper metal compound pattern 540 and the capping pattern 560. In some example embodiments, the lower metal pattern 510, the lower metal compound pattern 520, the metal pattern 530, the upper metal compound pattern 540, the upper metal pattern 550, and the capping pattern 560 may sequentially stacked in the first direction D1 and may constitute an uppermost conductive line (i.e., the fourth conductive line CL4).

As a result of the thermal treatment process, hydrogen atoms in the passivation layer 480 may be diffused into the substrate 100 through the fourth conductive line CL4 and the fourth conductive contact CT4. In the case where the thickness 510LT of the lower metal layer 510L or the thickness 550LT of the upper metal layer 550L of FIG. 5 is larger than 200 Å, the thickness 510T of the remaining portion of the lower metal pattern 510 or the thickness 550T of the remaining portion of the upper metal pattern 550 may be relatively thick, and in this case, an amount of hydrogen atoms in the remaining portion of the lower metal pattern 510 or the remaining portion of the upper metal pattern 550 may be increased. Accordingly, the mechanical/electric characteristics of the fourth conductive line CL4 may be deteriorated. According to some example embodiments of the inventive concepts, the thickness 510LT or 550LT of the lower or upper metal layer 510L or 550L of FIG. 5 may be controlled to be smaller than or equal to 200 Å. Thus, the thickness 510T of the remaining portion of the lower metal pattern 510 or the thickness 550T of the remaining portion of the upper metal pattern 550 may be relatively thin, and in this case, an amount of hydrogen atoms left in the remaining portion of the lower metal pattern 510 or the remaining portion of the upper metal pattern 550 may be minimized. Thus, it may be possible to prevent or suppress the mechanical/electric characteristics of the fourth conductive line CL4 from being deteriorated, or reduce the magnitude of the deterioration of such mechanical/electrical characteristics.

In some example embodiments, during the thermal treatment process, the entirety of the lower metal pattern 510 may react with a lower portion of the metal pattern 530 to form the lower metal compound pattern 520. Furthermore, during the thermal treatment process, the entirety of the upper metal pattern 550 may react with an upper portion of the metal pattern 530 to form the upper metal compound pattern 540. In this case, as described with reference to FIGS. 1 and 4, the lower metal compound pattern 520, the metal pattern 530, the upper metal compound pattern 540, and the capping pattern 560 may be sequentially stacked in the first direction D1 and may constitute an uppermost conductive line (i.e., the fourth conductive line CL4). In other words, the fourth conductive line CL4 may not include the lower and upper metal patterns 510 and 550.

Figure 8:
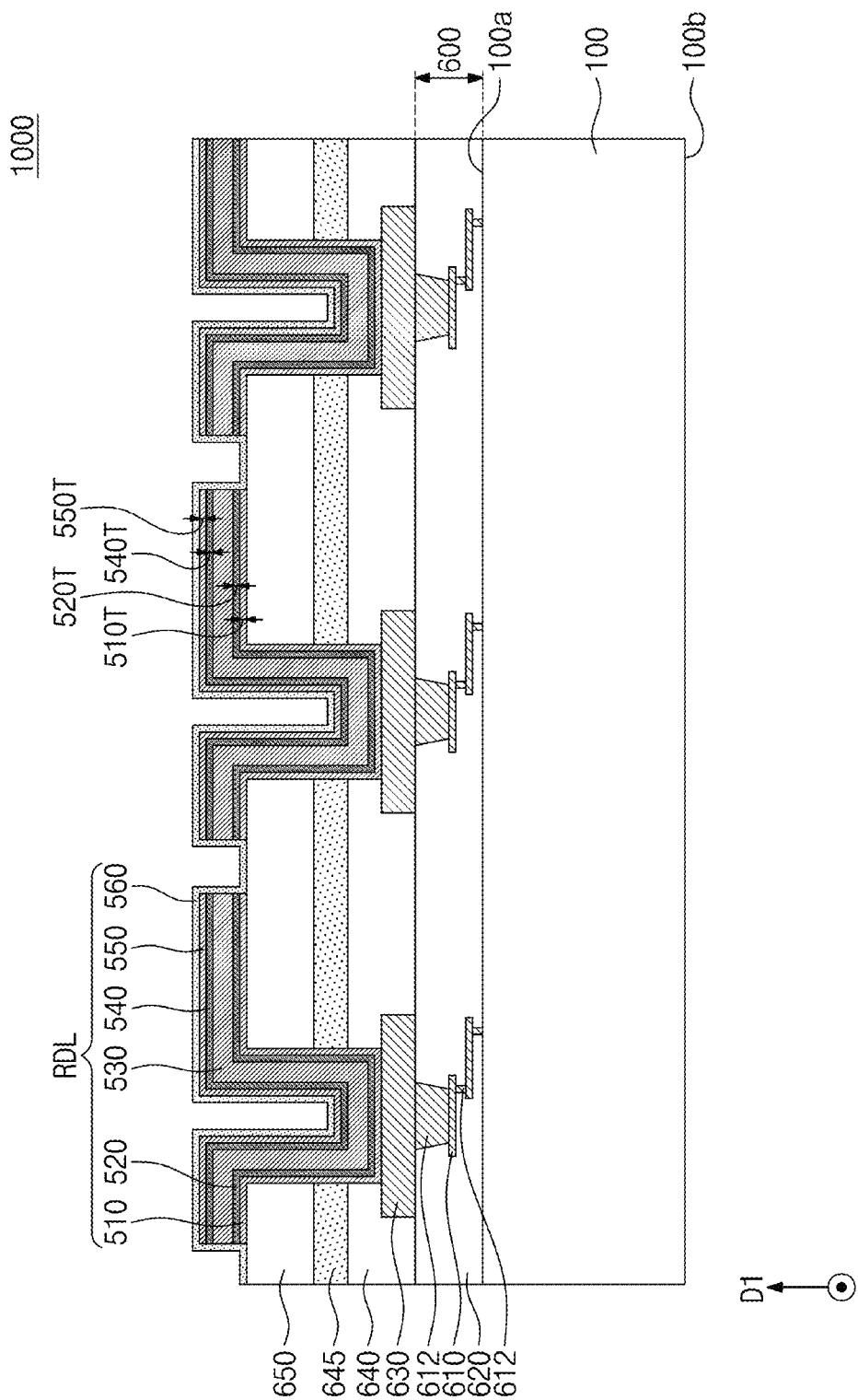
FIG. 8 is a sectional view illustrating a semiconductor device according to some example embodiments of the inventive concepts.

FIG. 8 is a sectional view illustrating a semiconductor device according to some example embodiments of the inventive concepts.

Referring to FIG. 8, a semiconductor device 1000 may include a substrate 100, a circuit layer 600, a conductive pad 630, a first insulating layer 640, a protection layer 645, a second insulating layer 650, and a redistribution pattern RDL. The semiconductor device 1000 may be a semiconductor chip (e.g., a memory chip, a logic chip, or a buffer chip). The substrate 100 may be a semiconductor substrate, which is formed of or includes a semiconductor material (e.g., silicon, germanium, or silicon-germanium). The substrate 100 may have a first surface 100a and a second surface 100b, which are opposite to each other.

The circuit layer 600 may be disposed on the first surface 100a of the substrate 100. The circuit layer 600 may include an interconnection structure 610 or 612 and an interconnection insulating layer 620. The interconnection structure 610 or 612 may include interconnection patterns 610 and via patterns 612 connected to the interconnection patterns 610. The interconnection patterns 610 and the via patterns 612 may be formed of or include a metallic material (e.g., aluminum or copper). The interconnection structure 610 or 612 may be electrically connected to an integrated circuit that is formed on the first surface 100a of the substrate 100. The integrated circuit may include transistors which are formed on the first surface 100a of the substrate 100. The interconnection insulating layer 620 may be disposed on the first surface 100a of the substrate 100 and may cover the integrated circuit and the interconnection structure 610 or 612. The interconnection insulating layer 620 may be formed of or include at least one of silicon oxide, silicon nitride, and/or silicon oxynitride.

The conductive pad 630 may be provided on the first surface 100a of the substrate 100 and on the circuit layer 600 and may be connected to the circuit layer 600. The conductive pad 630 may be connected to the interconnection structure 610 or 612 and may be electrically connected to the integrated circuit through the interconnection structure 610 or 612. The conductive pad 630 may be a chip pad and may be formed of or include a metallic material (e.g., aluminum).

The first insulating layer 640 may be provided on the first surface 100a of the substrate 100 to cover the circuit layer 600 and the conductive pad 630. The first insulating layer 640 may be formed of or include at least one of, for example, silicon oxide, silicon nitride, and/or silicon oxynitride. The protection layer 645 may be provided on the first surface 100a of the substrate 100 to cover the first insulating layer 640. The protection layer 645 may be formed of or include, for example, silicon nitride. The second insulating layer 650 may be provided on the first surface 100a of the substrate 100 to cover the protection layer 645. The second insulating layer 650 may be formed of or include, for example, silicon oxide and/or tetraethyl orthosilicate. The first insulating layer 640, the protection layer 645, and the second insulating layer 650 may be referred to as an insulating layer.

The redistribution pattern RDL may be disposed on the second insulating layer 650. A portion of the redistribution pattern RDL may be provided to penetrate the second insulating layer 650, the protection layer 645, and the first insulating layer 640 and may be connected to the conductive pad 630. Another portion of the redistribution pattern RDL may be extended to a region on a top surface of the second insulating layer 650.

The redistribution pattern RDL may include a lower metal pattern 510, a lower metal compound pattern 520, a metal pattern 530, an upper metal compound pattern 540, an upper metal pattern 550, and a capping pattern 560, which are sequentially stacked. The lower metal pattern 510 may be interposed between the conductive pad 630 and the lower metal compound pattern 520, between the first insulating layer 640 and the lower metal compound pattern 520, between the protection layer 645 and the lower metal compound pattern 520, and between the second insulating layer 650 and the lower metal compound pattern 520. The lower metal compound pattern 520 may be interposed between the conductive pad 630 and the metal pattern 530, between the first insulating layer 640 and the metal pattern 530, between the protection layer 645 and the metal pattern 530, and between the second insulating layer 650 and the metal pattern 530. The lower metal pattern 510 may be spaced apart from (e.g., isolated from direct contact with) the metal pattern 530 with the lower metal compound pattern 520 interposed therebetween.

The metal pattern 530 may be interposed between the lower and upper metal compound patterns 520 and 540. The upper metal compound pattern 540 may be spaced apart from (e.g., isolated from direct contact with) the lower metal compound pattern 520 with the metal pattern 530 interposed therebetween, and the upper metal pattern 550 may be spaced apart from (e.g., isolated from direct contact with) the metal pattern 530 with the upper metal compound pattern 540 interposed therebetween. The capping pattern 560 may be extended along a top surface of the upper metal pattern 550 and may cover side surfaces of the upper metal pattern 550, the upper metal compound pattern 540, the metal pattern 530, the lower metal compound pattern 520, and the lower metal pattern 510. In some example embodiments, the capping pattern 560 may be provided to cover the top surface of the second insulating layer 650 and may be extended along the top surface of the second insulating layer 650.

The lower metal pattern 510, the lower metal compound pattern 520, the metal pattern 530, the upper metal compound pattern 540, the upper metal pattern 550, and the capping pattern 560 may be substantially the same as the lower metal pattern 510, the lower metal compound pattern 520, the metal pattern 530, the upper metal compound pattern 540, the upper metal pattern 550, and the capping pattern 560 described with reference to FIGS. 1 to 3. In this case, the thicknesses in the first direction D1 (i.e., 510T, 520T, 540T, and 550T) of the lower metal pattern 510, the lower metal compound pattern 520, the upper metal compound pattern 540, and the upper metal pattern 550 may be values, which are measured in the first direction D1 perpendicular to the first surface 100a of the substrate 100 on the top surface of the conductive pad 630 or the top surface of the second insulating layer 650. Accordingly, a thickness in the first direction D1 of the lower metal compound pattern 520 (e.g., thickness 520T) may be greater than a thickness in the first direction D1 of the lower metal pattern 510 (e.g., thickness 510T), and a thickness in the first direction D1 of the upper metal compound pattern 540 (e.g., thickness 540T) may be greater than the thickness in the first direction D1 of the upper metal pattern 550 (e.g., thickness 550T).

In some example embodiments, the redistribution pattern RDL may not include the lower and upper metal patterns 510 and 550. In this case, the lower metal compound pattern 520, the metal pattern 530, the upper metal compound pattern 540, and the capping pattern 560 of the redistribution pattern RDL may be substantially the same as the lower metal compound pattern 520, the metal pattern 530, the upper metal compound pattern 540, and the capping pattern 560 described with reference to FIGS. 1 to 4.

According to some example embodiments of the inventive concepts, the redistribution pattern RDL may include the metal pattern 530, the lower metal compound pattern 520 in contact with the bottom surface of the metal pattern 530, and the upper metal compound pattern 540 in contact with the top surface of the metal pattern 530. The metal pattern 530 may include the first metallic element (e.g., aluminum), and each of the lower and upper metal compound patterns 520 and 540 may include a metal compound containing the first metallic element and the second metallic element (e.g., titanium), where the second metallic element is different from the first metallic element. Each of the lower and upper metal patterns 510 and 550 may include the second metallic element. Since the redistribution pattern RDL includes the lower and upper metal compound patterns 520 and 540 that are in contact with the bottom and top surfaces, respectively, of the metal pattern 530, it may be possible to increase the mechanical strength of the redistribution pattern RDL and to prevent a disconnection failure from occurring in the redistribution pattern RDL, or reduce the magnitude or size of the occurred disconnection failure. In addition, since the lower and upper metal compound patterns 520 and 540 are provided to be in contact with the bottom and top surfaces, respectively, of the metal pattern 530, it may be possible to prevent or suppress a failure, such as void, from occurring in the metal pattern 530, or reduce the magnitude or size of the occurred failure (e.g., void size).

Accordingly, it may be possible to improve electrical and reliability characteristics of the semiconductor device.

According to some example embodiments of the inventive concepts, the uppermost one of conductive lines may include a metal pattern and lower and upper metal compound patterns, which are in contact with bottom and top surfaces of the metal pattern, respectively. The metal pattern may include a first metallic element, and each of the lower and upper metal compound patterns may include a metal compound, which includes the first metallic element and a second metallic element. The second metallic element may be different from the first metallic element. Since the uppermost conductive line includes the metal pattern and the lower and upper metal compound patterns that are in contact with the bottom and top surfaces, respectively, of the metal pattern, it may be possible to increase a mechanical strength of the uppermost conductive line and moreover to prevent or suppress a disconnection failure from occurring in the uppermost conductive line, or reduce the magnitude or size of the occurred disconnection failure. In addition, since the lower and upper metal compound patterns are provided to be in contact with the bottom and top surfaces, respectively, of the metal pattern, it may be possible to prevent or suppress a failure, such as void, from occurring in the metal pattern, or reduce the magnitude or size of the occurred failure (e.g., void size).

Accordingly, it may be possible to improve electrical and reliability characteristics of the semiconductor device.

Figure 9:
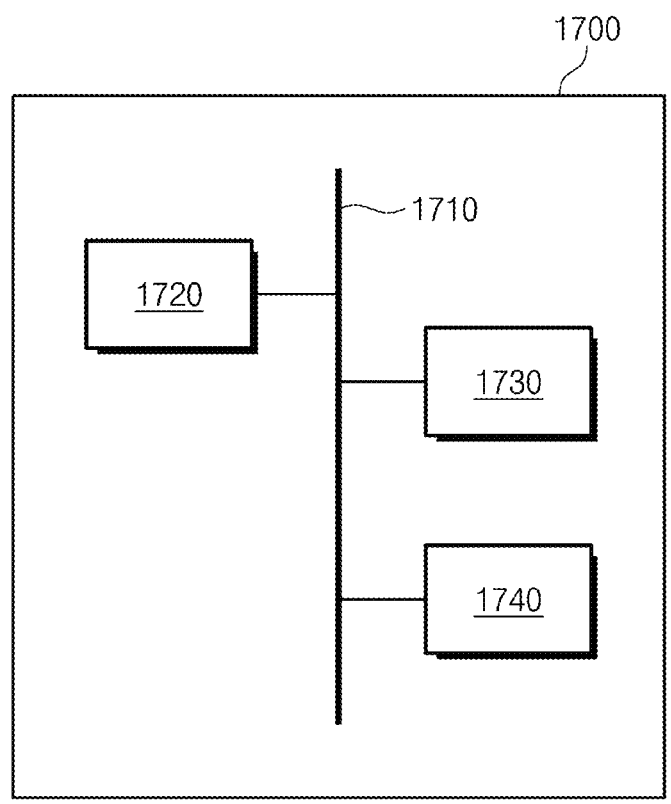
FIG. 9 is a diagram illustrating an electronic device according to some example embodiments.

FIG. 9 is a diagram illustrating an electronic device 1700 according to some example embodiments.

Referring to FIG. 9, the electronic device 1700 includes a memory 1720, a processor 1730, and a communication interface 1740.

The electronic device 1700 may be included in one or more various electronic devices. In some example embodiments, the electronic device 1700 may include a computing device. A computing device may include a personal computer (PC), a tablet computer, a laptop computer, a netbook, some combination thereof, or the like. The memory 1720, the processor 1730, and the communication interface 1740 may communicate with one another through a bus 1710.

In some example embodiments, the electronic device 1700 may include a semiconductor device described referring to FIGS. 1 to 8. In some example embodiments, the memory 1720 and/or the processor 1730 may include one or more semiconductor devices that is described referring to FIGS. 1 to 8.

The communication interface 1740 may communicate data from an external device using various Internet protocols. The external device may include, for example, a computing device.

The processor 1730 may execute a program and control the electronic device 1700. A program code to be executed by the processor 1730 may be stored in the memory 1720. An electronic system may be connected to an external device through an input/output device (not shown) and exchange data with the external device.

The memory 1720 may store information. The memory 1720 may be a volatile or a nonvolatile memory. The memory may be a DRAM device. The memory 1720 may be a non-transitory computer readable storage medium. The memory may store computer-readable instructions that, when executed, cause the execution of one or more methods, functions, processes, etc. as described herein. In some example embodiments, the processor 1730 may execute one or more of the computer-readable instructions stored at the memory 1720.

In some example embodiments, the communication interface 1740 may include a USB and/or HDMI interface. In some example embodiments, the communication interface 1740 may include a wireless communication interface.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a lower structure including a substrate and a cell structure on the substrate; and
a plurality of interconnection layers, which are stacked on the lower structure in a first direction that extends perpendicular to a top surface of the substrate,
wherein an uppermost interconnection layer of the plurality of interconnection layers includes:
an uppermost interlayer insulating layer,
uppermost conductive lines horizontally spaced apart from each other on the uppermost interlayer insulating layer, and
a passivation layer covering the uppermost interlayer insulating layer and the uppermost conductive lines and comprising a hydrogen-containing insulating material,
wherein each of the uppermost conductive lines includes a lower metal compound pattern, a metal pattern, an upper metal compound pattern, and a capping pattern, which are sequentially stacked in the first direction,
wherein the lower metal compound pattern, the metal pattern, and the upper metal compound pattern include a same metallic element, and
wherein the passivation layer covers top and side surfaces of the uppermost conductive lines.

2. The semiconductor device of claim 1, wherein
the upper metal compound pattern is between the metal pattern and the capping pattern, and
the upper metal compound pattern is in contact with a top surface of the metal pattern.

3. The semiconductor device of claim 2, wherein
the lower metal compound pattern is in contact with a bottom surface of the metal pattern, and
the lower metal compound pattern includes a same material as the upper metal compound pattern.

4. The semiconductor device of claim 1, wherein
the metal pattern includes aluminum,
each of the lower and upper metal compound patterns includes aluminum and an additional metallic element, and
the additional metallic element is different from the aluminum.

5. The semiconductor device of claim 4, wherein each of the lower and upper metal compound patterns includes an aluminum-titanium compound.

6. The semiconductor device of claim 1, wherein
each of the uppermost conductive lines further includes
a lower metal pattern isolated from direct contact with the metal pattern with the lower metal compound pattern therebetween, and
an upper metal pattern between the upper metal compound pattern and the capping pattern,
the metal pattern includes a first metallic element, and
each of the lower and upper metal patterns includes a second metallic element different from the first metallic element.

7. The semiconductor device of claim 6, wherein each of the lower and upper metal compound patterns includes an alloy of the first and second metallic elements.

8. The semiconductor device of claim 7, wherein the first metallic element is aluminum.

9. The semiconductor device of claim 8, wherein the second metallic element is titanium.

10. The semiconductor device of claim 7, wherein
the lower metal pattern has a first thickness in the first direction, and
the lower metal compound pattern has a second thickness in the first direction that is greater than the first thickness in the first direction of the lower metal pattern.

11. The semiconductor device of claim 10, wherein
the upper metal pattern has a third thickness in the first direction, and
the upper metal compound pattern has a fourth thickness in the first direction that is greater than the third thickness in the first direction of the upper metal pattern.

12. A semiconductor device, comprising:
a conductive line on a substrate; and
a passivation layer on the substrate such that the passivation layer covers top and side surfaces of the conductive line,
wherein the conductive line includes a lower metal pattern, a lower metal compound pattern, a metal pattern, an upper metal compound pattern, an upper metal pattern and a capping pattern, which are sequentially stacked in a first direction perpendicular that extends to a top surface of the substrate,
wherein the metal pattern includes aluminum,
wherein each of the lower and upper metal compound patterns includes a metal compound, the metal compound containing aluminum and an additional metallic element, and
wherein the lower and upper metal compound patterns have a lower resistivity than that of the lower and upper metal patterns.

13. The semiconductor device of claim 12, wherein the additional metallic element is titanium.

14. The semiconductor device of claim 12, wherein the capping pattern includes a nitride of the additional metallic element.

15. The semiconductor device of claim 12, wherein
the lower metal pattern is isolated from direct contact with the metal pattern with the lower metal compound pattern therebetween; and
the upper metal pattern is disposed between the upper metal compound pattern and the capping pattern,
wherein each of the lower and upper metal patterns includes the additional metallic element.

* * * * *